US012751107B2

(12) United States Patent
Bhandari et al.

(10) Patent No.: US 12,751,107 B2
(45) Date of Patent: Sep. 29, 2026

(54) PHOTOVOLTAIC DEVICES WITH NARROW SCRIBES AND METHODS AND SYSTEMS FOR FORMING THE SAME

(71) Applicant: First Solar, Inc., Tempe, AZ (US)

(72) Inventors: Nikhil Bhandari, Perrysburg, OH (US); Charles Wickersham, Perrysburg, OH (US)

(73) Assignee: First Solar, Inc., Phoenix, AZ (US)

( * ) Notice: Subject to any disclaimer, the term of this patent is extended or adjusted under 35 U.S.C. 154(b) by 784 days.

(21) Appl. No.: 18/105,512

(22) Filed: Feb. 3, 2023

(65) Prior Publication Data

US 2023/0187572 A1 Jun. 15, 2023

Related U.S. Application Data

(62) Division of application No. 16/975,037, filed as application No. PCT/US2019/018916 on Feb. 21, 2019, now Pat. No. 11,581,453.

(60) Provisional application No. 62/634,511, filed on Feb. 23, 2018.

(51) Int. Cl.

| | |
|---|---|
| ***H10F 71/00*** | (2025.01) |
| ***H10F 19/90*** | (2025.01) |
| ***H10F 77/123*** | (2025.01) |
| ***H10F 77/20*** | (2025.01) |
| ***H10F 77/30*** | (2025.01) |

(52) U.S. Cl.

CPC ........... *H10F 71/00* (2025.01); *H10F 19/908* (2025.01); *H10F 71/125* (2025.01); *H10F 77/123* (2025.01); *H10F 77/244* (2025.01); *H10F 77/311* (2025.01)

(58) Field of Classification Search

CPC ...... H10F 71/00; H10F 19/908; H10F 71/125; H10F 77/123; H10F 77/244; H10F 77/311; H10F 19/33; Y02E 10/543

See application file for complete search history.

(56) References Cited

U.S. PATENT DOCUMENTS 11,581,453 B2 2/2023 Bhandari et al.
2011/0298156 A1 12/2011 Hooper et al.
2012/0094422 A1* 4/2012 Ghandour ............. B23K 26/36 219/121.75
2012/0111841 A1 5/2012 Murison et al.

FOREIGN PATENT DOCUMENTS

CA 2772727 A1 * 10/2012 ......... B23K 26/0622

OTHER PUBLICATIONS

PCT International Search Report and Written Opinion, Application No. PCT/US2019/018916, dated Jul. 12, 2019.

* cited by examiner

*Primary Examiner* — Fernando L Toledo
*Assistant Examiner* — Jorge Andres Lopez
(74) *Attorney, Agent, or Firm* — MacMillan, Sobanski & Todd, LLC

(57) ABSTRACT

According to the embodiments provided herein, a method for scribing a layer stack of a photovoltaic device can include directing a laser scribing waveform to a film side of a layer stack. The laser scribing waveform can include pulse groupings that repeat at a group repetition period of greater than or equal to 1.5 μs. Each pulse of the pulse groupings can have a pulse width of less than or equal to 900 fs.

17 Claims, 7 Drawing Sheets

PHOTOVOLTAIC DEVICES WITH NARROW SCRIBES AND METHODS AND SYSTEMS FOR FORMING THE SAME

CROSS-REFERENCE TO RELATED APPLICATIONS

This is a divisional application of U.S. application Ser. No. 16/975,037, filed Aug. 21, 2020, and claims the benefit of international application PCT/US2019/018916, filed Feb. 21, 2019, and U.S. Provisional Application 62/634,511, filed Feb. 23, 2018; each of which is incorporated by reference in the entirety.

BACKGROUND

The present specification generally relates to photovoltaic devices with scribes and, more specifically, laser scribing methods for forming photovoltaic devices with narrow scribes.

A photovoltaic device generates electrical power by converting light into electricity using semiconductor materials that exhibit the photovoltaic effect. Photovoltaic devices include a number of layers that can be divided into cells separated according to one or more sets of scribes. The scribes can be formed through the semiconductor material. Thus, the width and shape of the scribes can impact the overall efficiency of the photovoltaic device.

Accordingly, a need exists for photovoltaic devices with narrow scribes and methods for forming the same.

SUMMARY

The embodiments provided herein relate to photovoltaic devices with narrow scribes and laser scribing methods for forming the same. These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of photovoltaic devices having narrow scribes are provided herein. Generally, the scribes can be formed using laser pulses having a relatively short pulse width and a relatively low frequency. Various embodiments of the photovoltaic device and methods for forming the photovoltaic device will be described in more detail herein.

Figure 1:
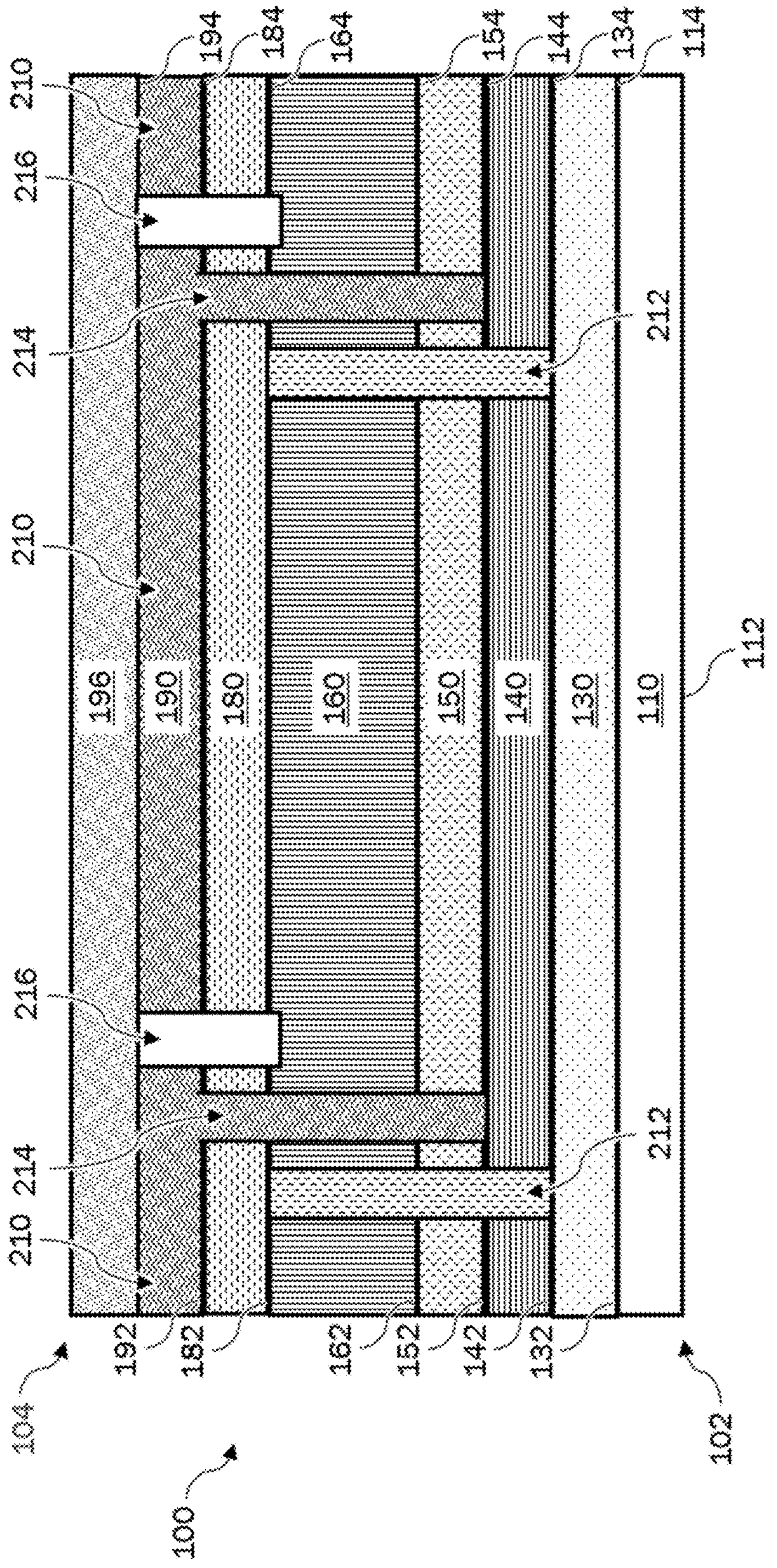
FIG. 1 schematically depicts a photovoltaic device according to one or more embodiments shown and described herein.

Referring now to FIG. 1, an embodiment of a photovoltaic device 100 is schematically depicted. The photovoltaic device 100 can be configured to receive light and transform light into electrical signals, e.g., photons can be absorbed from the light and transformed into electrical signals via the photovoltaic effect. Accordingly, the photovoltaic device 100 can define an energy side 102 configured to be exposed to a light source such as, for example, the sun. The photovoltaic device 100 can also define an opposing side 104 offset from the energy side 102 such as, for example, by a plurality of material layers. It is noted that the term "light" can refer to various wavelengths of the electromagnetic spectrum such as, but not limited to, wavelengths in the ultraviolet (UV), infrared (IR), and visible portions of the electromagnetic spectrum. The photovoltaic device 100 can include a plurality of layers disposed between the energy side 102 and the opposing side 104. As used herein, the term "layer" refers to a thickness of material provided upon a surface. Each layer can cover all or any portion of the surface.

Figure 2:
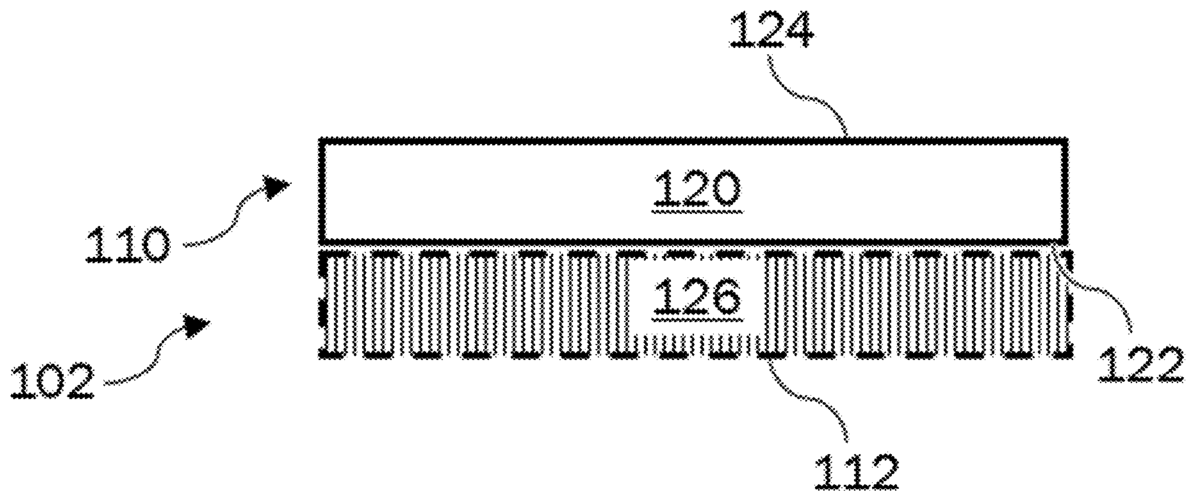
FIG. 2 schematically depicts a substrate according to one or more embodiments shown and described herein.

The photovoltaic device 100 can include a substrate 110 configured to facilitate the transmission of light into the photovoltaic device 100. The substrate 110 can be disposed at the energy side 102 of the photovoltaic device 100. Referring collectively to FIGS. 1 and 2, the substrate 110 can have a first surface 112 substantially facing the energy side 102 of the photovoltaic device 100 and a second surface 114 substantially facing the opposing side 104 of the photovoltaic device 100. One or more layers of material can be disposed between the first surface 112 and the second surface 114 of the substrate 110.

The substrate 110 can include a transparent layer 120 having a first surface 122 substantially facing the energy side 102 of the photovoltaic device 100 and a second surface 124 substantially facing the opposing side 104 of the photovoltaic device 100. In some embodiments, the second surface 124 of the transparent layer 120 can form the second surface 114 of the substrate 110. The transparent layer 120 can be formed from a substantially transparent material such as, for example, glass. Suitable glass can include soda-lime glass, or any glass with reduced iron content. The transparent layer 120 can have any suitable transmittance, including about 250 nm to about 1,300 nm in some embodiments, or about 250 nm to about 950 nm in other embodiments. The transparent layer 120 may also have any suitable transmission percentage, including, for example, more than about 50% in one embodiment, more than about 60% in another embodiment, more than about 70% in yet another embodiment, more than about 80% in a further embodiment, or more than about 85% in still a further embodiment. In one embodiment, transparent layer 120 can be formed from a glass with about 90% transmittance, or more. Optionally, the substrate 110 can include a coating 126 applied to the first surface 122 of the transparent layer 120. The coating 126 can be configured to interact with light or to improve durability of the substrate 110 such as, but not limited to, an antireflective coating, an antisoiling coating, or a combination thereof.

Referring again to FIG. 1, the photovoltaic device 100 can include a barrier layer 130 configured to mitigate diffusion of contaminants (e.g., sodium) from the substrate 110, which could result in degradation or delamination. The barrier layer 130 can have a first surface 132 substantially facing the energy side 102 of the photovoltaic device 100 and a second surface 134 substantially facing the opposing side 104 of the photovoltaic device 100. In some embodiments, the barrier layer 130 can be provided adjacent to the substrate 110. For example, the first surface 132 of the barrier layer 130 can be provided upon the second surface 114 of the substrate 100. The phrase "adjacent to," as used herein, means that two layers are disposed contiguously and without any intervening materials between at least a portion of the layers.

Generally, the barrier layer 130 can be substantially transparent, thermally stable, with a reduced number of pin holes and having high sodium-blocking capability, and good adhesive properties. Alternatively or additionally, the barrier layer 130 can be configured to apply color suppression to light. The barrier layer 130 can include one or more layers of suitable material, including, but not limited to, tin oxide, silicon dioxide, aluminum-doped silicon oxide, silicon oxide, silicon nitride, or aluminum oxide. The barrier layer 130 can have any suitable thickness bounded by the first surface 132 and the second surface 134, including, for example, more than about 500 Å in one embodiment, more than about 750 Å in another embodiment, or less than about 1200 Å in a further embodiment.

Referring still to FIG. 1, the photovoltaic device 100 can include a transparent conductive oxide (TCO) layer 140 configured to provide electrical contact to transport charge carriers generated by the photovoltaic device 100. The TCO layer 140 can have a first surface 142 substantially facing the energy side 102 of the photovoltaic device 100 and a second surface 144 substantially facing the opposing side 104 of the photovoltaic device 100. In some embodiments, the TCO layer 140 can be provided adjacent to the barrier layer 130. For example, the first surface 142 of the TCO layer 140 can be provided upon the second surface 134 of the barrier layer 130. Generally, the TCO layer 140 can be formed from one or more layers of n-type semiconductor material that is substantially transparent and has a wide band gap. Specifically, the wide band gap can have a larger energy value compared to the energy of the photons of the light, which can mitigate undesired absorption of light. The TCO layer 140 can include one or more layers of suitable material, including, but not limited to, tin dioxide, doped tin dioxide (e.g., F—$SnO_2$), indium tin oxide, or cadmium stannate.

The photovoltaic device 100 can include a buffer layer 150 configured to provide an insulating layer between the TCO layer 140 and any adjacent semiconductor layers. The buffer layer 150 can have a first surface 152 substantially facing the energy side 102 of the photovoltaic device 100 and a second surface 154 substantially facing the opposing side 104 of the photovoltaic device 100. In some embodiments, the buffer layer 150 can be provided adjacent to the TCO layer 140. For example, the first surface 152 of the buffer layer 150 can be provided upon the second surface 144 of the TCO layer 140. The buffer layer 140 may include material having higher resistivity than the TCO later 140, including, but not limited to, intrinsic tin dioxide, zinc magnesium oxide (e.g., $Zn_{1-x}Mg_xO$), silicon dioxide ($SnO_2$), aluminum oxide ($Al_2O_3$), aluminum nitride (AlN), zinc tin oxide, zinc oxide, tin silicon oxide, or any combination thereof. In some embodiments, the material of the buffer layer 140 can be configured to substantially match the band gap of an adjacent semiconductor layer (e.g., an absorber). The buffer layer 150 may have any suitable thickness between the first surface 152 and the second surface 154, including, for example, more than about 100 Å in one embodiment, between about 100 Å and about 800 Å in another embodiment, or between about 150 Å and about 600 Å in a further embodiment.

Referring again to FIG. 1, the photovoltaic device 100 can include an absorber layer 160 configured to cooperate with another layer and form a p-n junction within the photovoltaic device 100. Accordingly, absorbed photons of the light can free electron-hole pairs and generate carrier flow, which can yield electrical power. The absorber layer 160 can have a first surface 162 substantially facing the energy side 102 of the photovoltaic device 100 and a second surface 164 substantially facing the opposing side 104 of the photovoltaic device 100. A thickness of the absorber layer 160 can be defined between the first surface 162 and the second surface 164. The thickness of the absorber layer 160 can be between about 0.5 μm to about 10 μm such as, for example, between about 1 μm to about 7 μm in one embodiment, or between about 2 μm to about 5 μm in another embodiment.

According to the embodiments described herein, the absorber layer 160 can be formed from a p-type semiconductor material having an excess of positive charge carriers, i.e., holes or acceptors. The absorber layer 160 can include any suitable p-type semiconductor material such as group II-VI semiconductors. Specific examples include, but are not limited to, semiconductor materials comprising cadmium, tellurium, selenium, or any combination thereof. Suitable examples include, but are not limited to, ternaries of cadmium, selenium and tellurium (e.g., $CdSe_xTe_{1-x}$), or a compound comprising cadmium, selenium, tellurium, and one or more additional element.

In embodiments where the absorber layer 160 comprises tellurium and cadmium, the atomic percent of the tellurium can be greater than or equal to about 25 atomic percent and less than or equal to about 50 atomic percent such as, for example, greater than about 30 atomic percent and less than about 50 atomic percent in one embodiment, greater than about 40 atomic percent and less than about 50 atomic percent in a further embodiment, or greater than about 47 atomic percent and less than about 50 atomic percent in yet another embodiment. It is noted that the atomic percent described herein is representative of the entirety of the absorber layer 160, the atomic percentage of material at a particular location within the absorber layer 160 can vary with thickness compared to the overall composition of the absorber layer 160.

In embodiments where the absorber layer 160 comprises selenium and tellurium, the atomic percent of the selenium in the absorber layer 160 can be greater than about 0 atomic percent and less or equal to than about 25 atomic percent such as, for example, greater than about 1 atomic percent and less than about 20 atomic percent in one embodiment, greater than about 1 atomic percent and less than about 15 atomic percent in another embodiment, or greater than about 1 atomic percent and less than about 8 atomic percent in a further embodiment. It is noted that the concentration of tellurium, selenium, or both can vary through the thickness of the absorber layer 160. For example, when the absorber layer 160 comprises a compound including selenium at a mole fraction of x and tellurium at a mole fraction of 1-x ($Se_xTe_{1-x}$), x can vary in the absorber layer 160 with distance from the first surface 162 of the absorber layer 160.

According to the embodiments provided herein, the absorber layer 160 can be doped with a dopant configured to manipulate the charge carrier concentration. In some embodiments, the absorber layer can be doped with a group I or V dopant such as, for example, copper, arsenic, phosphorous, antimony, or a combination thereof. The total dosage of the dopant within the absorber layer 160 can be controlled. Alternatively or additionally, the amount of the dopant can vary with distance from the first surface 162 of the absorber layer 160.

Referring still to FIG. 1, the p-n junction can be formed by providing the absorber layer 160 sufficiently close to a portion of the photovoltaic device 100 having an excess of negative charge carriers, i.e., electrons or donors. In some embodiments, the absorber layer 160 can be provided adjacent to n-type semiconductor material. Alternatively, one or more intervening layers can be provided between the absorber layer 160 and n-type semiconductor material. In some embodiments, the absorber layer 160 can be provided adjacent to the buffer layer 150. For example, the first surface 162 of the absorber layer 160 can be provided upon the second surface 154 of the buffer layer 150.

Figure 3:
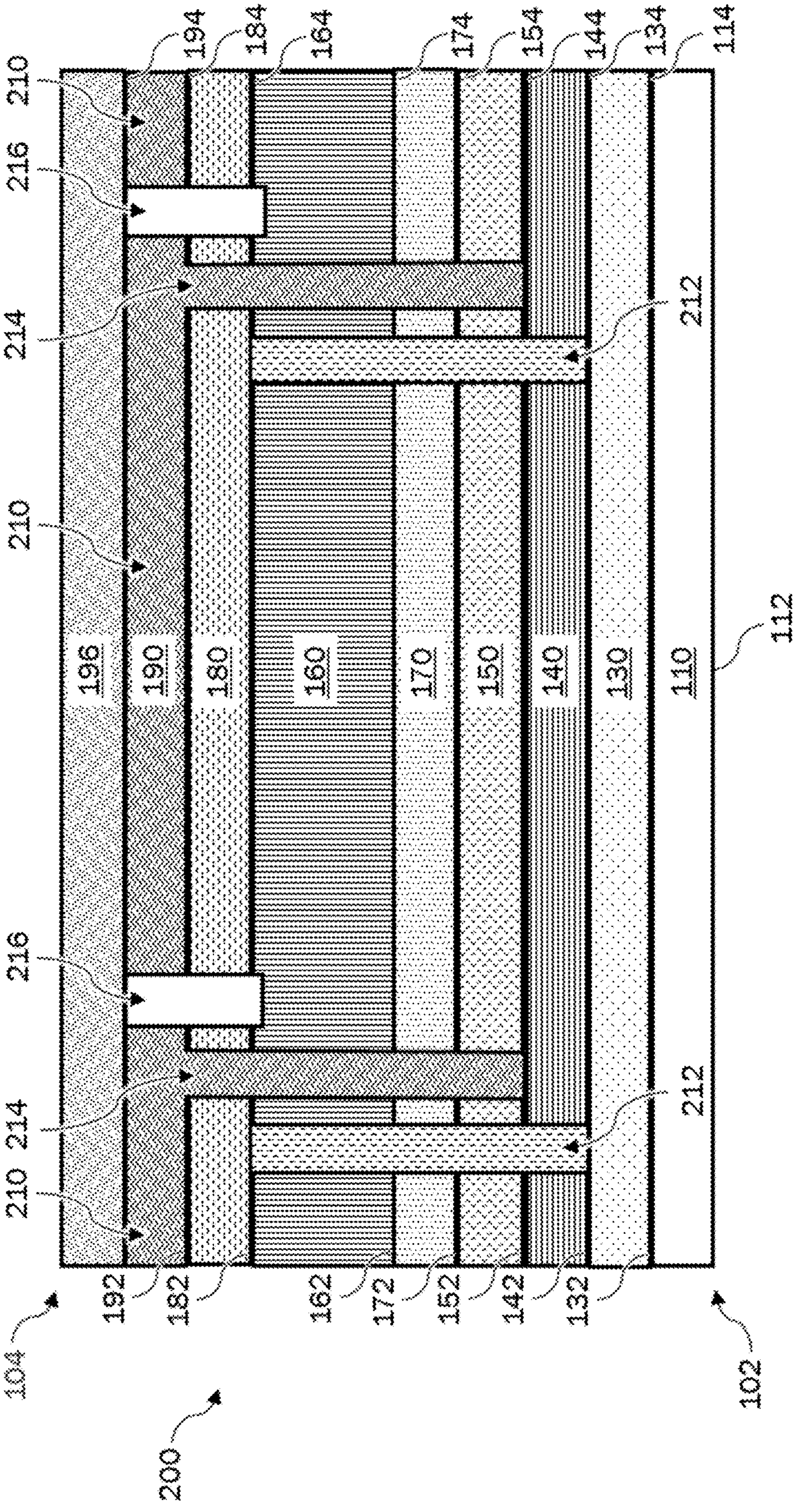
FIG. 3 schematically depicts a photovoltaic device according to one or more embodiments shown and described herein.

Referring now to FIG. 3, in some embodiments, a photovoltaic device 200 can include a window layer 170 comprising n-type semiconductor material. The absorber layer 160 can be formed adjacent to the window layer 170. The window layer 170 can have a first surface 172 substantially facing the energy side 102 of the photovoltaic device 100 and a second surface 174 substantially facing the opposing side 104 of the photovoltaic device 100. In some embodiments, the window layer 170 can be positioned between the absorber layer 160 and the TCO layer 20. In one embodiment, the window layer 170 can be positioned between the absorber layer 160 and the buffer layer 150. The window layer 170 can include any suitable material, including, for example, cadmium sulfide, zinc sulfide, cadmium zinc sulfide, zinc magnesium oxide, or any combination thereof.

Referring collectively to FIGS. 1 and 3, the photovoltaic device 100 can include a back contact layer 180 configured to mitigate undesired alteration of the dopant and to provide electrical contact to the absorber layer 160. The back contact layer 180 can have a first surface 182 substantially facing the energy side 102 of the photovoltaic device 100 and a second surface 184 substantially facing the opposing side 104 of the photovoltaic device 100. A thickness of the back contact layer 180 can be defined between the first surface 182 and the second surface 184. The thickness of the back contact layer 180 can be between about 5 nm to about 200 nm such as, for example, between about 10 nm to about 50 nm in one embodiment.

In some embodiments, the back contact layer 180 can be provided adjacent to the absorber layer 160. For example, the first surface 182 of the back contact layer 180 can be provided upon the second surface 164 of the absorber layer 160. In some embodiments, the back contact layer 180 can include binary or ternary combinations of materials from groups I, II, VI, such as for example, one or more layers containing zinc, copper, cadmium and tellurium in various compositions. Further exemplary materials include, but are not limited to, zinc telluride doped with copper telluride, or zinc telluride alloyed with copper telluride.

The photovoltaic device 100 can include a conducting layer 190 configured to provide electrical contact with the absorber layer 160. The conducting layer 190 can have a first surface 192 substantially facing the energy side 102 of the photovoltaic device 100 and a second surface 194 substantially facing the opposing side 104 of the photovoltaic device 100. In some embodiments, the conducting layer 190 can be provided adjacent to the back contact layer 180. For example, the first surface 192 of the conducting layer 190 can be provided upon the second surface 184 of the back contact layer 180. The conducting layer 190 can include any suitable conducting material such as, for example, one or more layers of nitrogen-containing metal, silver, nickel, copper, aluminum, titanium, palladium, chrome, molybdenum, gold, or the like. Suitable examples of a nitrogen-containing metal layer can include aluminum nitride, nickel nitride, titanium nitride, tungsten nitride, selenium nitride, tantalum nitride, or vanadium nitride.

The photovoltaic device 100 can include a back support 196 configured to cooperate with the substrate 110 to form a housing for the photovoltaic device 100. The back support 196 can be disposed at the opposing side 102 of the photovoltaic device 100. For example, the back support 196 can be formed adjacent to conducting layer 190. The back support 196 can include any suitable material, including, for example, glass (e.g., soda-lime glass).

Referring still to FIGS. 1 and 3, manufacturing of a photovoltaic device 100, 200 generally includes sequentially disposing functional layers or layer precursors in a "stack" of layers through one or more processes, including, but not limited to, sputtering, spray, evaporation, molecular beam deposition, pyrolysis, closed space sublimation (CSS), pulse laser deposition (PLD), chemical vapor deposition (CVD), electrochemical deposition (ECD), atomic layer deposition (ALD), or vapor transport deposition (VTD).

Manufacturing of a photovoltaic device 100, 200 can further include the selective removal of the certain layers of the stack of layers, i.e., scribing, to divide the photovoltaic device into 100, 200 a plurality of cells 210. For example, a first isolation scribe 212 (also referred to as P1 scribe) can be formed to ensure that the TCO layer 140 is electrically isolated between cells 210. Specifically, the first isolation scribe 212 can be formed though the TCO layer 140, the buffer layer 150, and the absorber layer 160 of photovoltaic device 100, or though the TCO layer 140, the buffer layer 150, the window layer 170, and the absorber layer 160 of photovoltaic device 200. Accordingly, the first isolation scribe 212 can be formed after the absorber layer 160 is deposited. The first isolation scribe 212 can then be filled with dielectric material before deposition of the back contact layer 180 and the conducting layer 190.

A series connecting scribe 214 (also referred to as P2 scribe) can be formed to electrically connect cells 210 in series. For example, the series connecting scribe 214 can be utilized to provide a conductive path from the conductive layer 190 of one cell 210 to the TCO layer 140 of another cell 210. The series connecting scribe 214 can be formed though the absorber layer 160, and the back contact layer 180 of photovoltaic device 100, or through the window layer 170, the absorber layer 160, and the back contact layer 180 of photovoltaic device 200. Optionally, the series connecting scribe 214 can be formed though some or all of the buffer layer 150. Accordingly, the series connecting scribe 214 can be formed after the back contact layer 180 is deposited. The series connecting scribe 214 can then be filled with a conducting material such as, but not limited to, the material of the conducting layer 190.

A second isolation scribe 216 (also referred to as P3 scribe) can be formed to isolate the back contact 190 into individual cells 210. The second isolation scribe 216 can be formed the conductive layer 190, the back contact layer 180, and at least a portion of the absorber layer 160. According to the embodiments provided herein, each of the first isolation scribe 212, the series connecting scribe 214, and the second isolation scribe 216 can be formed via laser cutting or laser scribing.

Figure 4:
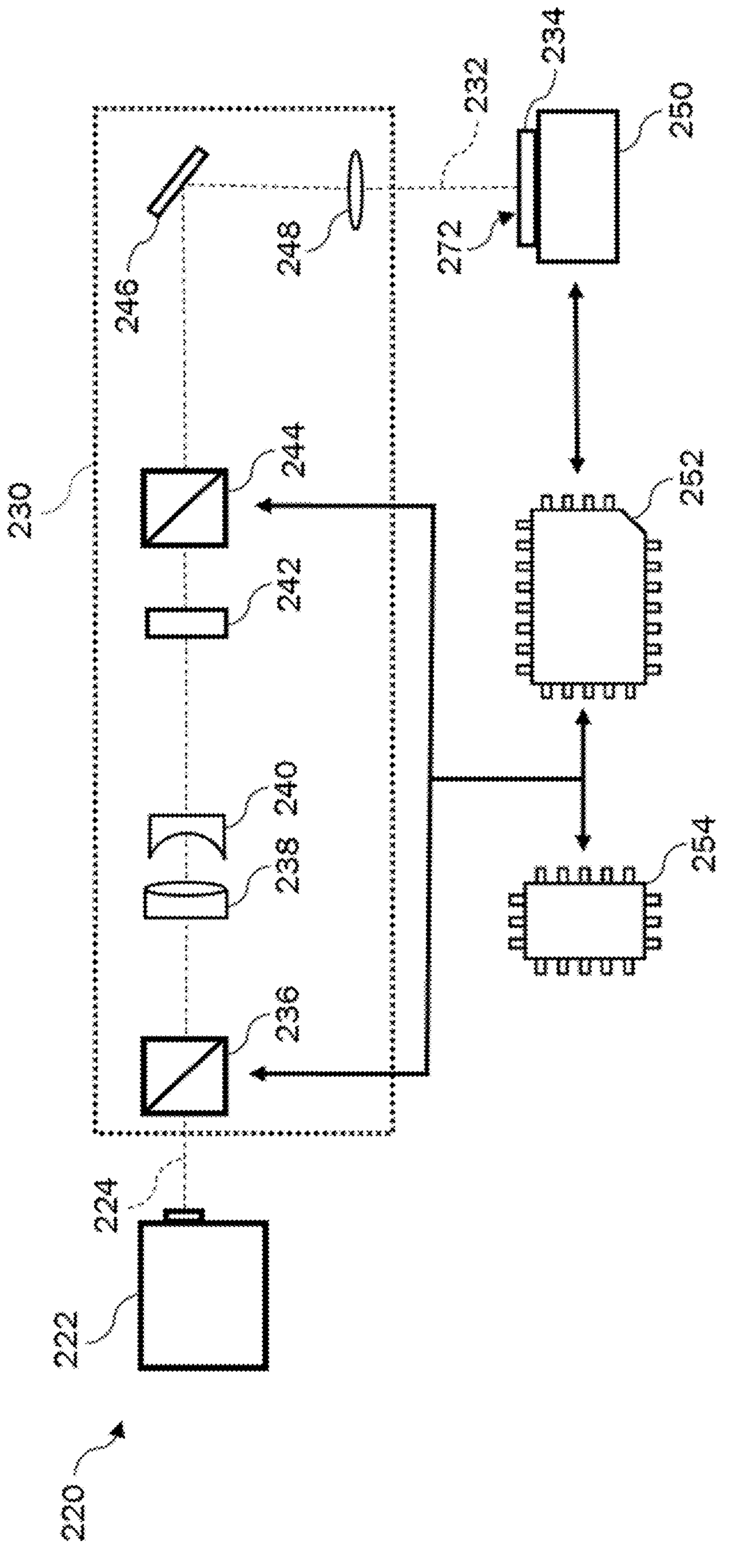
FIG. 4 schematically depicts a system for laser scribing according to one or more embodiments shown and described herein.

Referring to FIG. 4, a system 220 for laser scribing is schematically depicted. The system 220 can include a laser source 222 for generating laser waveform 224 for input into modulating optics 230. With collective reference to FIGS. 4 and 5, the laser waveform 224 can include a plurality of pulses 226 at a source repetition rate, such as, for example, less than or equal to about 1 Mhz. The pulses 226 are generally provided at a wavelength corresponding to the material properties of the material to be removed. The wavelength can be between about 300 nm to about 1,500 nm. For example, in some embodiments, the first isolation scribe 212 (FIGS. 1 and 3) can be formed using a wavelength between about 300 nm and about 1,100 nm such as, for example, between about 300 nm and about 400 nm in one embodiment. Alternatively or additionally, the series connecting scribe 214 (FIGS. 1 and 3) can be formed using a wavelength between about 300 nm and about 600 nm such as, for example, between about 500 nm and about 600 nm in one embodiment. Alternatively or additionally, the second isolation scribe 216 (FIGS. 1 and 3) can be formed using a wavelength between about 300 nm and about 1,100 nm such as, for example, between about 1,000 nm and about 1,100 nm in one embodiment.

Each pulse 226 can have a pulse width ($1/e^2$) of less than or equal to about 900 fs such as for example, between about 100 fs and about 800 fs in one embodiment, between about 200 fs and about 700 fs in another embodiment. Each pulse 226 can have a beam diameter ($1/e^2$) of less than or equal to about 3 mm and a pulse energy of greater than or equal to about 40 μJ. The pulses 226 can be provided at a pulse repetition period 228 of greater than or equal to about 1 μs, which corresponds to a pulse repetition rate of at least 1 MHz. A suitable example of a laser source 222 is the Monaco diode-pumped femtosecond industrial laser by Coherent Inc. of Santa Clara, CA, USA, which can produce pulses 226 having a wavelength of about 1035 nm.

The system 220 can include modulating optics 230 for transforming the laser waveform 224 into a laser scribing waveform 232 for performing laser scribing upon a layer stack 234. The modulating optics 230 can include a waveplate and beam splitter 236 in optical communication with the laser source 222. The waveplate and beam splitter 236 can be configured as an optical beam dump. Accordingly, the waveplate and beam splitter 236 can be operable to control the power level of the laser scribing waveform 232. As used herein, the term "optically coupled" means that the components are arranged and spaced relative to one another in order to propagate an optical signal (e.g., electromagnetic signals in the visible or infrared portion of the electromagnetic spectrum) along a desired path.

A collimator 238 and beam expander 240 (e.g., a 3× beam expander) can be in optical communication with the waveplate and beam splitter 236. A waveplate 242 can be in optical communication with the beam expander 240. The waveplate 242 can be configured to control the polarization state of the laser scribing waveform 232. For example, the waveplate 242 can be operable to retard the received waveform by λ/2. Other suitable retardation values can include λ/4, 1λ, or the like. The waveplate 242 can be in optical communication with a waveplate and beam splitter 244 configured for power mapping. Accordingly, the power of the laser scribing waveform 232 can be monitored. The waveplate and beam splitter 244 can be in optical communication with a mirror 246 for directing the laser scribing waveform 232 towards the layer stack 234. The modulating optics 230 can include a lens 248 for focusing the laser scribing waveform 232 upon the layer stack 234. Accordingly, laser scribing waveform 232 can be focused to a beam diameter ($1/e^2$) of less than or equal to about 50 μm such as, for example, greater than or equal to about 0.5 μm and less than or equal to about 20 μm in one embodiment, greater than or equal to about 0.75 μm and less than or equal to about 15 μm in another embodiment, or greater than or equal to about 1 μm and less than or equal to about 10 μm in a further embodiment.

Referring again to FIG. 4, the system 220 can include automated actuator 250 for causing relative motion between the laser scribing waveform 232 and the layer stack 234. Accordingly, the automated actuator 250 can be coupled to the layer stack 234, the modulating optics 230, the laser source 222, or any combination thereof. The automated actuator 250 can be any device suitable to automatically actuate and orient the laser scribing waveform 232 to a desired position and angle with respect to the layer stack 234. For example, the automated actuator 250 can be a multi-axis device that is communicatively coupled to one or more processors 252, which is generally depicted in FIG. 4 as double arrowed lines. Moreover, the automated actuator 250 can include angular and/or linear sensors that provide information regarding the location of the automated actuator 250 in physical space (e.g., three-dimensional coordinates indicative of the location). As used herein, the term "communicatively coupled" means that the components are capable of exchanging data signals with one another such as, for example, electrical signals via conductive medium, electromagnetic signals via air, optical signals via optical waveguides, and the like.

According to the embodiments described herein, a processor means any device capable of executing machine readable instructions. Accordingly, each of the one or more processors 252 may be a controller, an integrated circuit, a microchip, a computer, or any other computing device. The one or more processors 252 can be configured to execute logic or software and perform functions that control relative movement of the laser scribing waveform 232 and the layer stack 234, as well as the properties of the laser scribing waveform 232. Additionally, the one or more processors 252 can be communicatively coupled to one or more memory components 254 that can store the logic and/or input received by the one or more processors 252. The memory components 254 described herein may be RAM, ROM, a flash memory, a hard drive, or any device capable of storing machine readable instructions.

Embodiments of the present disclosure comprise logic that includes machine readable instructions or an algorithm written in any programming language of any generation (e.g., 1GL, 2GL, 3GL, 4GL, or 5GL) such as, e.g., machine language that may be directly executed by the processor, or assembly language, object-oriented programming (OOP), scripting languages, microcode, etc., that may be compiled or assembled into machine readable instructions and stored on a machine readable medium. Alternatively, the logic or algorithm may be written in a hardware description language (HDL), such as logic implemented via either a field-programmable gate array (FPGA) configuration or an application-specific integrated circuit (ASIC), and their equivalents. Accordingly, the logic may be implemented in any conventional computer programming language, as pre-programmed hardware elements, or as a combination of hardware and software components. The logic can be configured such that, when executed by the one or more processors 252, the system 220 operates to automatically synchronize relative movement between the laser scribing waveform 232 and the layer stack 234 with modulation of the laser scribing waveform 232.

In some embodiments, the wave plate and beam splitter 236 can be communicatively coupled to the one or more processors 252. Accordingly, the one or more processors 252 can transmit control signals to the wave plate and beam splitter 236 indicative of a desired power level of the laser scribing waveform 232. For example, the control signals received by the wave plate and beam splitter 236 can be configured to cause the wave plate and beam splitter 236 adjust the amount of power that is dumped from the laser waveform 224. Additionally, the wave plate and beam splitter 244 can be communicatively coupled to the one or more processors 252. Accordingly, the one or more processors 252 can receive signals from the wave plate and beam splitter 244 indicative of the power level of the laser scribing waveform 232. Thus, the one or more processors 252 can automatically compare the power level of the laser scribing waveform 232 to the desired power level of the laser scribing waveform 232. The comparison can be used to automatically determine the control signals.

Figure 5:
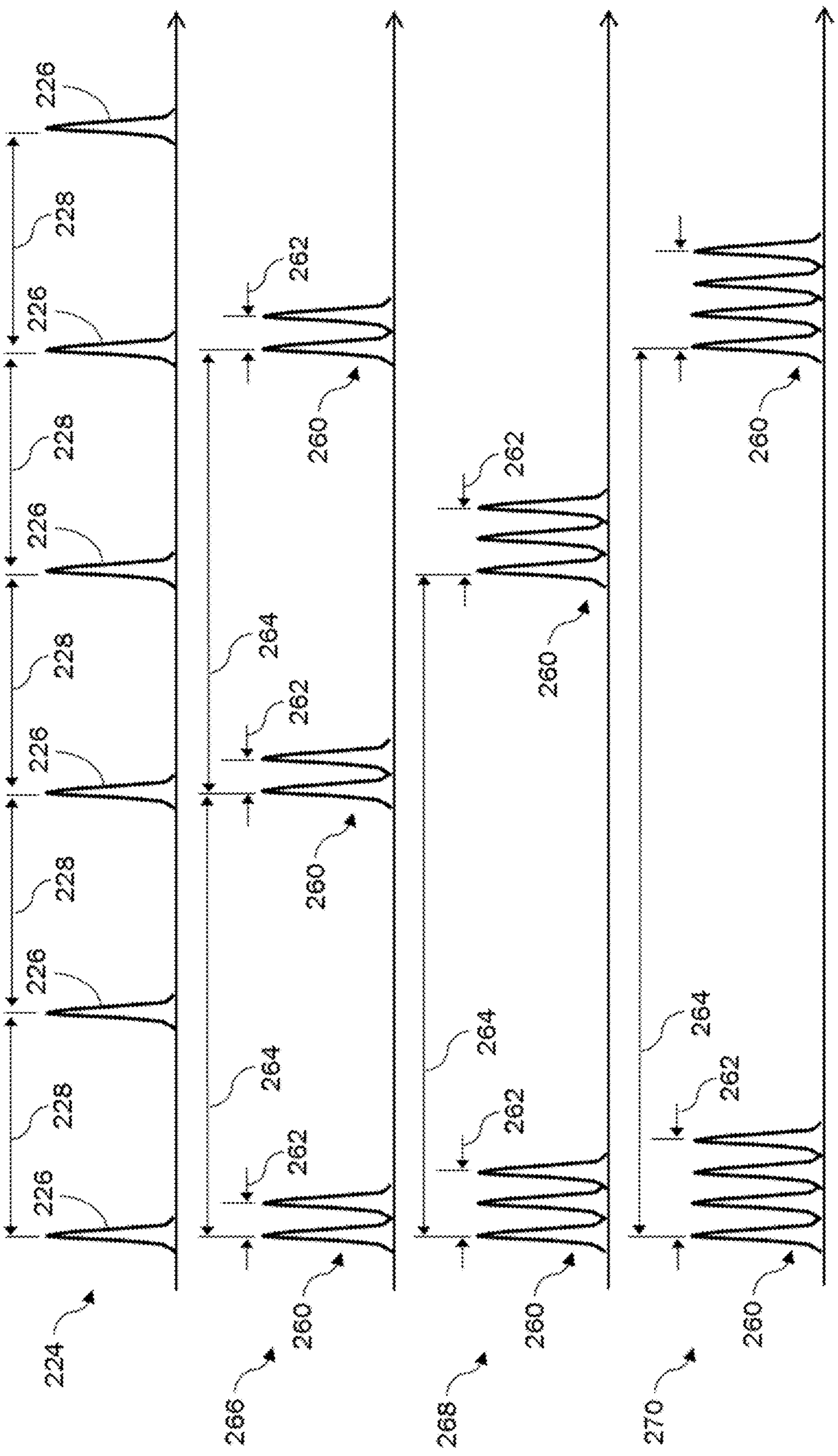
FIG. 5 schematically depicts laser waveforms according to one or more embodiments shown and described herein.

Referring collectively to FIGS. 4 and 5, the modulating optics 230 can be configured to modulate the laser scribing waveform 232 such that the laser scribing waveform 232 includes a burst waveform. The burst waveforms can include pulses 260 having a relatively low pulse energy compared to the pulses 226 of the laser waveform 224. For example, the pulse energy of the pulses 260 can be less than or equal to about 10 μJ such as, for example, less than or equal to about 5 μJ in one embodiment, between about 0.1 μJ and about 2 μJ in another embodiment, or between about 0.2 μJ and about 1 μJ in a further embodiment. The pulses 260 can be arranged into pulse groupings 262 of two or more pulses 260, where the pulses 260 repeat at a higher rate compared to the pulse repetition period 228 of the laser waveform 224. For example, the pulses 260 repeat at rate having a pulse repetition of period of less than or equal to 100 nanoseconds (ns) such as, for example, less than or equal to 50 ns in one embodiment, less than or equal to 20 ns in another embodiment, or less than or equal to 12.5 ns in another embodiment. The pulse groupings 262 can repeat at a group repetition period 264 that is relatively large compared to the pulse repetition period 228 of the laser waveform 224. For example, the group repetition period 264 can be at least about 1.5 μs such as, for example, at least about 1.75 μs in one embodiment, or between about 1.9 μs and about 5 μs in another embodiment. In one embodiment, the laser scribing waveform 232 can include a first burst waveform 266. The pulse groupings 262 of the first burst waveform 266 can consist of two of the pulses 260 with a group repetition period 264 of about 2 μs. Alternatively or additionally, the laser scribing waveform 232 can include a second burst waveform 268. The pulse groupings 262 of the second burst waveform 268 can consist of three of the pulses 260 with a group repetition period 264 of about 3 μs. Alternatively or additionally, the laser scribing waveform 232 can include a third burst waveform 270. The pulse groupings 262 of the third burst waveform 270 can consist of four of the pulses 260 with a group repetition period 264 of about 4 μs.

Figure 6:
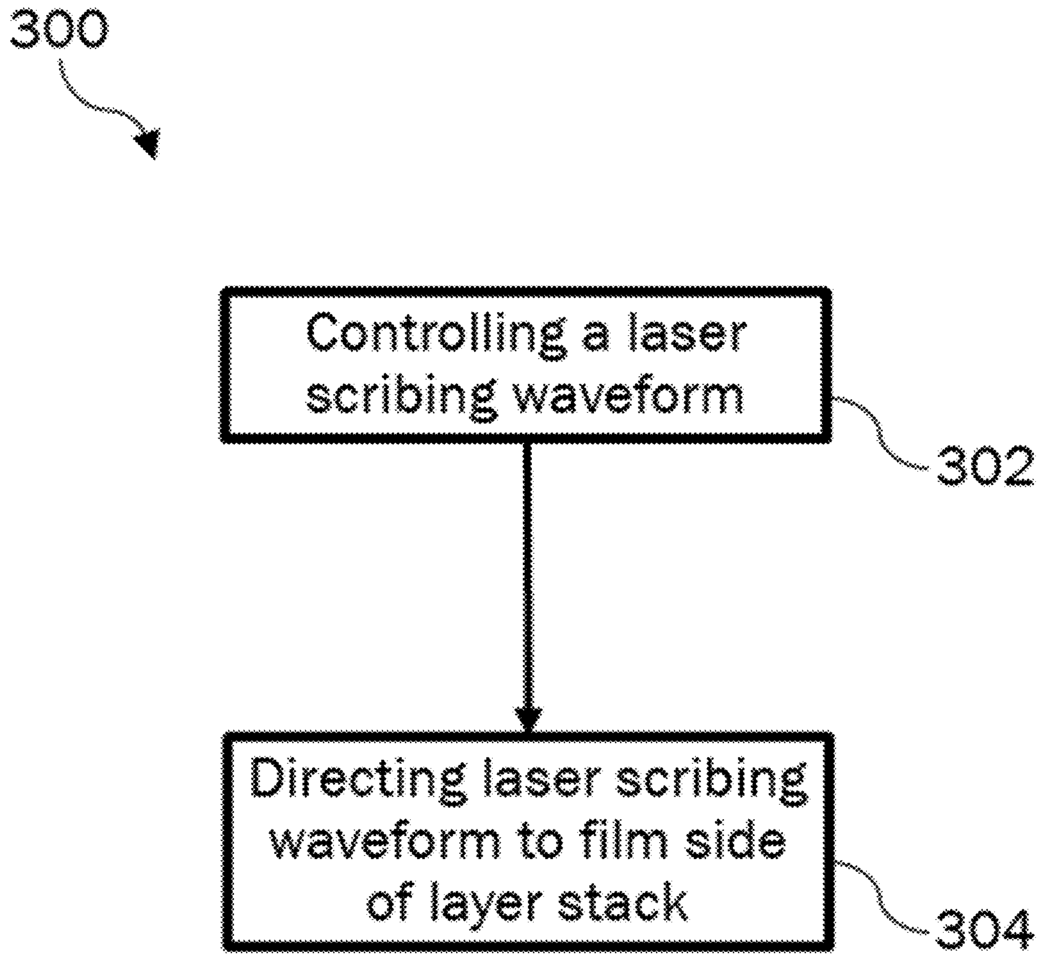
FIG. 6 schematically depicts a method for laser scribing according to one or more embodiments shown and described herein.

Referring collectively to FIGS. 4, 5, and 6, the embodiments provided herein relate to a method 300 for scribing a layer stack 232 with the laser scribing waveform 232. The method 300 can include a process 302 for controlling the laser scribing waveform 232. For example, the one or more processors 252 can execute machine readable instructions to automatically control one or more parameters of the laser scribing waveform 232, such as, for example, pulse energy of the pulses 260, beam diameter of the pulses 260, pulse width of the pulses 260, number of pulses 260 within a pulse grouping 262, group repetition period 264, or combinations thereof. Alternatively or additionally, the one or more processors 252 can control a scan rate of the laser scribing waveform 232, i.e., the rate of motion between the laser scribing waveform 232 and the layer stack 234. Generally, the scan rate is greater than or equal to about 1 m/s such as for example, between about 1.5 m/s and about 2.5 m/s in one embodiment. The process 302 can be implemented automatically using the system 220, as a non-limiting example.

Referring collectively to FIGS. 1, 3, 4, and 6, the method 300 can include a process 304 for directing the laser scribing waveform 234 to a film side 272 of the layer stack 234. For example, the laser scribing waveform 234 can be in optical communication with the sacrificial material of a layer (e.g., TCO layer 140, buffer layer 150, absorber layer 160, window layer 170, back contact layer 180, conducting layer 190) without traversing any intervening layer of the layer stack 234. As noted above, the layer stack 234 can be formed by sequentially depositing layers. In some embodiments, the layers can be deposited first upon the substrate 110 and layered towards the conducting layer 190 prior to applying the back support 196. In such instances, scribing can also performed prior to applying the back support 196. Accordingly, the film side 172 can generally correspond to the portion of the layer furthest from the energy side 102 of the photovoltaic device 100, 200. At least initially (prior to removal of material from the layer) the film side 272 can correspond to one of the second surfaces such as, for example, the second surface 144 TCO layer 140, the second surface 154 of the buffer layer 150, the second surface 164 of the absorber layer 160, the second surface 174 of the window layer 170, the second surface 184 of the back contact layer 180, or the second surface 194 of the conducting layer 190. Thus, the laser scribing waveform 234 can impact the film side without traveling through the substrate 110 prior to impacting the film side. In alternative embodiments, the layers can be deposited first upon the back support 196 and layered towards the TCO layer 140 or barrier layer 130 prior to applying the substrate 110. In such instances, scribing can be performed prior to applying the substrate 110, and the film side 172 would generally correspond to the portion of the layer furthest from the opposite side 104 of the photovoltaic device 100, 200.

Figure 7:
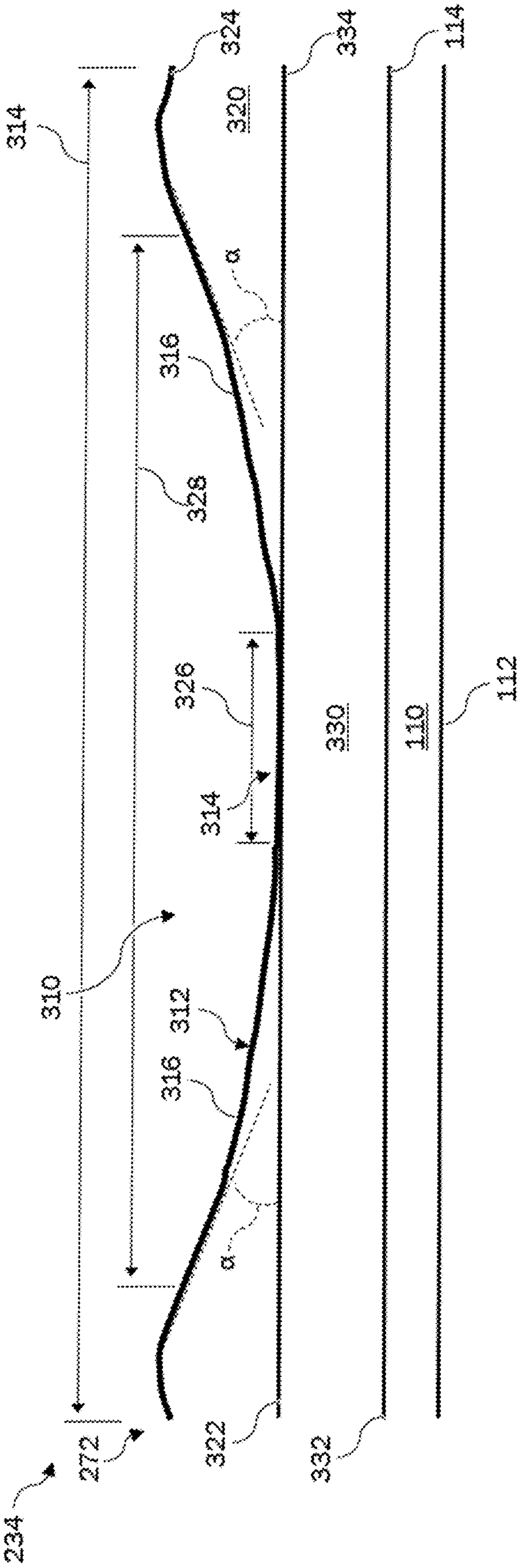
FIG. 7 schematically depicts a scribe formed according to one or more embodiments shown and described herein.

Referring collectively to FIGS. 1, 3, and 7, scribing performed as described herein can result in a scribe 310 that is relatively narrow compared to existing scribes. The scribe 310 can be formed into one or more scribed layers 320 in order to form a void near one or more intervening layers 330. The scribe 310 can correspond to any of the first isolation scribe 212, the series connecting scribe 214, or the second isolation scribe 216. Accordingly, when forming the first isolation scribe 212, the one or more scribed layers 320 can include the TCO layer 140, the buffer layer 150, the absorber layer 160, and, optionally, the window layer 170. The one or more scribed layers 320 can include a first surface 322 corresponding to the first surface 142 of the TCO layer 140 and a second surface 324 corresponding to the second surface 164 of the absorber layer 160. The one or more intervening layers 330 can include a first surface 332 corresponding to the first surface 132 of the barrier layer 130 and a second surface 334 corresponding to the second surface 134 of the barrier layer 130.

When forming the series connecting scribe 214, the one or more scribed layers 320 can include the buffer layer 150, the absorber layer 160, the back contact layer 180, and, optionally, the window layer 170. The first surface 322 of the one or more scribed layers 320 can correspond to the first surface 152 of the buffer layer 150 and the second surface 324 can correspond to the second surface 184 of the back contact layer 180. Alternatively, in embodiments, where the buffer layer 150 is only partially removed, the first surface 322 of the one or more scribed layers 320 can correspond to the first surface 162 of the absorber layer 160. The first surface 332 of the one or more intervening layers 330 can correspond to the first surface 132 of the barrier layer 130 and the second surface 334 can correspond to the second surface 144 of the TCO layer 140. Alternatively, in embodiments, where the buffer layer 150 is only partially removed, the second surface 334 of the one or more intervening layers 330 can correspond to the second surface 154 of the buffer layer 150. When forming the series connecting scribe 214, the one or more scribed layers 320 can include the back contact layer 180, the conductive layer 190, and, optionally, the window layer 170. The first surface 322 of the one or more scribed layers 320 can correspond to the first surface 182 of the back contact layer 180 and the second surface 324 can correspond to the second surface 194 of the conducting layer 190. The first surface 332 of the one or more intervening layers 330 can correspond to the first surface 132 of the barrier layer 130 and the second surface 334 can correspond to the second surface 164 of the absorber layer 160.

Referring collectively to FIGS. 5 and 7, the scribe 310 can define a contour 312 formed through the second surface 324 of the one or more scribed layers 320 and towards the second surface 334 of the one or more intervening layers 330. The contour 312 can extend through a laser effected width 314, which can correspond to the portion of the one or more scribed layers 330 that have a change in thickness, i.e., distance between the first surface 332 and the second surface 334, resulting from interaction with the laser scribing waveform 232. In some embodiments, the laser effected width 314 can be less than or equal to about 40 μm such as, for example, less than or equal to about 35 μm in one embodiment, or less than or equal to about 30 μm in another embodiment.

Without being bound to theory, it is believed that the short pulse width of the laser scribing waveform 232 can yield a contour 312 that is substantially arcuate. The contour 312 can include sidewalls 316 that extend from the portion of the second surface 324 of the one or more scribed layers 320 adjacent the laser effected width 314 to a trough 318 of the contour 312. The trough 318 can be defined as the region of the contour 312 where a substantial majority of the one or more scribed layers 320 is removed such as, for example, at least 99% of the thickness is removed in one embodiment, at least 99.5% of the thickness is removed in another embodiment, or at least 100% of the thickness is removed in a further embodiment, i.e., a portion of the one or more intervening layers 330 can be removed. Accordingly, the trough 318 can be defined by a trough width 326. The trough width 326 can be less than or equal to about 15 μm such as, for example, less than or equal to about 10 μm in one embodiment, less than or equal to about 5 μm in another embodiment, between about 1 μm and about 15 μm in a further embodiment. In some embodiments, the sidewalls 316 can have a maximum angle α formed with respect to the first surface 322 of the one or more scribed layers 320. The maximum angle α can be substantially acute such as, for example, between about 10° and about 40° in one embodiment, or between about 15° and about 35° in another embodiment.

The scribe 310 can be further defined by a removal width 328 that is bounded by and narrower than the laser effected width 314. The removal width 328 can be defined as the distance between sidewalls 316 at 90% of the thickness of the one or more scribed layers 320. In some embodiments, a ratio of the removal width 328 to the trough width 326 can be greater than or equal to about 5 such as, for example greater than about or equal to 10 in one embodiment, or between about 12 and about 25.

It should now be understood that the embodiments provided herein, relate to the use of laser scribing to improve the shape of the scribes, which can in turn improve the efficiency of a photovoltaic device formed using the laser scribing. For example, the present disclosure describes scribes with relatively narrow width, compared to previous methods. The narrowed scribes reduce area loss and increases the efficiency of the photovoltaic device.

According to the embodiments provided herein, a method for scribing a layer stack of a photovoltaic device can include directing a laser scribing waveform to a film side of a layer stack. A scribe can be formed through one or more scribed layers of the layer stack. The laser scribing waveform can include pulse groupings that repeat at a group repetition period of greater than or equal to 1.5 μs. Each of the pulse groupings can include two or more pulses that repeat at a pulse repetition of period of less than or equal to 100 nanoseconds. Each of the two or more pulses can have a pulse width of less than or equal to 900 fs.

According to the embodiments provided herein, a photovoltaic device can include one or more scribed layers and one or more intervening layers. The one or more scribed layers can have a thickness defined between a first surface and a second surface. The one or more scribed layers can include an absorber layer. The absorber layer can include cadmium and tellurium. The one or more intervening layers can be adjacent to the first surface of the one or more scribed layers. A scribe can be formed through the second surface of the one or more scribed layers and towards the one or more intervening layers. The scribe can define a contour that extends through a laser effected width of the one or more scribed layers. The laser effected width can be less than or equal to 40 μm. The contour can include sidewalls that extend from a portion of the second surface of the one or more scribed layers adjacent the laser effected width to a trough. The trough can define a portion of the contour where at least 99% of the thickness of the one or more scribed layers is removed. The trough width can be less than or equal to 15 μm. The sidewalls can define a maximum angle α formed with respect to the first surface of the one or more scribed layers. The maximum angle α can be acute.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method for scribing a layer stack of a photovoltaic device comprising:

directing a laser scribing waveform to a film side of a layer stack, whereby a scribe is formed through one or more scribed layers of the layer stack, and wherein:

the laser scribing waveform comprises pulse groupings that repeat at a group repetition period of greater than or equal to 1.5 μs, each of the pulse groupings comprises two or more pulses that repeat at a pulse repetition period of less than or equal to 100 ns, each of the two or more pulses have a pulse width of less than or equal to 900 fs, and the layer stack includes a substrate and one or more intervening layers disposed between the one or more scribed layers and the substrate, and wherein the scribe is formed without traversing the one or more intervening layers.

2. The method of claim 1, comprising generating relative motion between the laser scribing waveform and the layer stack at a scan rate, wherein the scan rate is greater than or equal to 1 m/s.

3. The method of claim 1, wherein each of the two or more pulses has a beam diameter greater than or equal to 0.5 μm and less than or equal to 20 μm.

4. The method of claim 1, wherein each of the two or more pulses has a pulse energy less than or equal to 10 μJ.

5. The method of claim 1, wherein each of the two or more pulses has a wavelength between 300 nm and 1,100 nm.

6. The method of claim 1, wherein each of the two or more pulses has a wavelength between 300 nm and 600 nm.

7. The method of claim 1, wherein the one or more scribed layers of the layer stack comprises an absorber layer, and wherein the absorber layer comprises cadmium and tellurium.

8. The method of claim 7, wherein the one or more scribed layers of the layer stack comprises a transparent conductive oxide layer.

9. The method of claim 7, wherein the one or more scribed layers of the layer stack comprises a back contact layer formed adjacent to a conductive layer.

10. The method of claim 1, wherein the scribe defines a contour that extends through a laser effected width of the one or more scribed layers.

11. The method of claim 10, wherein the laser effected width is less than or equal to 40 μm.

12. The method of claim 10, wherein the contour comprises sidewalls that extend from a portion of the one or more scribed layers adjacent the laser effected width to a trough.

13. The method of claim 12, wherein the trough defines a portion of the contour where at least 99% of the thickness of the one or more scribed layers is removed.

14. The method of claim 12, wherein the trough defines a trough width less than or equal to 15 μm.

15. The method of claim 14, wherein a removal width is defined by the sidewalls at a 90% thickness of the one or more scribed layers, and a ratio of the removal width to the trough width is greater than or equal to 5.

16. The method of claim 14, wherein a removal width is defined by the sidewalls at a 90% thickness of the one or more scribed layers, and a ratio of the removal width to the trough width is in a range between about 12 and about 25.

17. The method of claim 12, wherein the sidewalls define a maximum angle α formed with respect to the first surface of the one or more scribed layers, and the maximum angle α is acute.

* * * * *